United States Patent [19]

Davis, Jr. et al.

[11] 3,872,494

[45] Mar. 18, 1975

[54] FIELD-CONTOURED HIGH SPEED, HIGH VOLTAGE TRANSISTOR

[75] Inventors: John R. Davis, Jr., Export, Pa.; Surinder Krishna, Ballston Lake, N.Y.

[73] Assignee: Westinghouse Electric Corporation, Pittsburgh, Pa.

[22] Filed: Feb. 8, 1974

[21] Appl. No.: 440,934

[52] U.S. Cl. .......................... 357/34, 357/55, 357/89, 357/90, 357/88

[51] Int. Cl. .......................... H01l 11/06

[58] Field of Search .............. 357/34, 55, 88, 89, 90

[56] References Cited

UNITED STATES PATENTS

| | | | |
|---|---|---|---|
| 3,769,563 | 10/1973 | Krishna et al. | 357/34 |
| 3,777,227 | 12/1973 | Krishna et al. | 357/34 |
| 3,798,079 | 3/1974 | Chu | 357/34 |

*Primary Examiner*—Michael J. Lynch
*Assistant Examiner*—E. Wojciechowicz
*Attorney, Agent, or Firm*—C. L. Menzemer

[57] ABSTRACT

A high voltage transistor with high speed capability is disposed in a semiconductor body having a thickness greater than about 100 microns. The collector region adjoining one major surface of the semiconductor body has two collector portions: A first collector portion adjoins selected internal portions of the major surface and has an impurity concentration at the major surface of greater than about $8 \times 10^{18}$ atoms/cm$^3$. A second collector portion adjoins the major surface at peripheral portions contiguously around the first collector portion and adjoins the first collector portion interior of the body at said internal portions and has a resistivity throughout of greater than 30 ohm-cm. Said second collector portion at said internal portions has a substantially uniform thickness of at least about 30 microns and a reach-through voltage less than the avalanche breakdown voltage thereof, and said second collector portion at said peripheral portions has a thickness at least about 20% greater than the thickness of said second collector portion at said internal portions. Further, the width of the second collector portion at said peripheral portions is greater than 1 and preferably less than 3 times the thickness of the second collector portion at said internal portions. The base region of the transistor adjoins the second collector portion interior of the body and has a minority carrier diffusion length at least an order of magnitude greater than the thickness of the base region at said internal portions. Preferably, the first collector portion laterally circumscribes the emitter region of the transistor by at least the thickness of the second collector portion at the internal portions of the body.

5 Claims, 9 Drawing Figures

FIELD-CONTOURED HIGH SPEED, HIGH VOLTAGE TRANSISTOR

FIELD OF THE INVENTION

The present invention relates to semiconductor devices and particularly transistors.

BACKGROUND OF THE INVENTION

Bipolar transistors are old and well-known in the art. Generally a bipolar transistor is disposed in a semiconductor body having opposed major surfaces. It has emitter and collector regions formed of impurities of one conductivity type adjoining the opposed major surfaces, and a base region formed of impurities of the opposite conductivity type at least partially in the interior of the semiconductor body between the emitter and collector regions. Two PN junctions are thus formed in the semiconductor body, one at the transition between the emitter and base regions and one at the transition between the collector and base regions.

The voltage capacity of a transistor is dependent on the reverse breakdown voltage at the PN junction between the base and collector regions. The breakdown voltage in turn is a function of the width and the impurity concentrations of the adjacent regions, that is, the avalanche breakdown or punch-through voltage of either the collector or the base region, whichever shall occur first. For the high voltage capacity, the base generally has an impurity concentration at least an order of magnitude greater than the collector region so that the bias voltage is supported by a space-charge region primarily in the collector region. The voltage capacity is extended by merely reducing the impurity concentration and increasing the thickness of the collector region.

However, these changes also increase the bulk resistance and the saturation voltage of the collector region. The stored charge that must be removed from the collector region by diffusion and recombination on switching of the transistor from the conduction mode is correspondingly increased. In turn, the storage time, i.e. the time to remove the stored charge, is necessarily long with the storage time ($\tau_s$) being proportional to the square of the thickness ($W_c$) of the collector region. Therefore, it has been very difficult to make a high voltage transistor (i.e. above 400 volts) with high switching speed and appendent high frequency capability. Irradiation and gold doping techniques have been used to advantage to provide high speed, high voltage transistors. But even such specialized techniques have resulted in high collector saturation voltages and in turn high power dissipation.

Various proposals have been made to obtain high voltage capacity in the transistor without increasing the saturation voltage. One such proposal, set forth in U.S. Pat. No. 3,507,714, is to support the voltage primarily by a space-charge region extending into the base region by reducing the impurity concentration of the base region adjoining the collector region, while increasing the impurity concentration of the collector region. This proposal reduces the saturation voltage (emitter to collector) and in turn maintains to some extent the current and switching capacities of the transistor. However, this proposal results in a reduction in the injection efficiency and minority carrier lifetime in the base region and correspondingly reduces the gain and current capacity of the transistor.

Another proposal is simply to increase the impurity concentration in the collector adjoining the ohmic contact with that region, and away from the PN junction with the base region. The bulk resistance of the collector region and in turn the saturation voltage of the transistor are thus reduced while maintaining the breakdown voltage. However, the region of high impurity concentration cannot be extended into the collector region without reducing the breakdown voltage. The impurity concentration gradient in the high doped region of the collector region is too steep to support any appreciable part of the bias voltage.

A related problem in high voltage semiconductor devices is channeling effects at the periphery of the semiconductor body. Channeling is localized voltage breakdown at the surface of the body at a much lower voltage than reverse breakdown voltage across the space-charge region in the bulk of the body. It is believed to be caused by surface states and irregularities in the crystal lattice at the surface of the semiconductor body.

One way of reducing channeling has been to form a recess in the internal portions of the voltage supporting collector region of the device so that the collector reach-through voltage at the recess is much lower than the reverse breakdown voltage at the periphery of the body. Exemplary of disclosures of this proposal are U.S. Pat. Nos. 3,009,591 and 3,370,209. The effect is a high voltage semiconductor device with a voltage capacity corresponding to the voltage across the space-charge region at the internal portions of the collector region.

The solution to the channeling problem has not, however, provided an answer to the reverse breakdown voltage capacity. The recess formed in the internal portions of semiconductor body has been generally bowl-shaped and irregular, rather than substantially uniform in width. This results in erratic, current dependent storage times and erratic, localized voltage breakdown. Moreover, a high voltage transistor made by any of these techniques has a large amount of stored charge in the peripheral portions of the collector which must be removed primarily by diffusion and recombination, and in turn switching speed of the transistor is relatively low.

Accordingly, efforts have been directed to providing a transistor with a collector region having thin internal portions of substantially uniform thickness and a large surface area, and thick peripheral portions of narrow width. One such transistor is disclosed in our U.S. Pat. No. 3,769,563, granted Oct. 30, 1973 and assigned to the same assignee as the present invention. The present invention provides yet another way of providing a transistor with high voltage capacity without sacrificing low saturation voltage and high turn-off times.

SUMMARY OF THE INVENTION

A transistor is provided with both high voltage and high speed capability. The transistor is disposed in a semiconductor body having first and second opposed major surfaces, having a thickness greater than 100 microns and preferably a resistivity of at least about 30 ohm-cm.

The transistor is comprised of an emitter region of a given conductivity type disposed in said semiconductor body adjoining selected internal portions of preferably greater than 0.1 $cm^2$ of the first major surface, and a collector region of the same conductivity type as the emitter region disposed in the semiconductor body adjoining the second major surface.

The collector region has two collector portions: a first collector portion adjoins selected internal portions of the second major surface of the body and has a surface impurity concentration at the second major surface of greater than about $8 \times 10^{18}$ atoms/cm$^3$. A second collector portion adjoins peripheral portions of the second major surface contiguously around the first collector portion and adjoins the first collector portion interior of the body. The second collector portion has a resistivity therethrough of greater than about 30 ohm-cm and perferably greater than 80 ohm-cm, preferably corresponding to the resistivity of the semiconductor body.

The second collector portion of the collector region also has a substantially uniform thickness at the internal portions of greater than about 30 microns and preferably greater than about 50 microns, and the second collector portion has a reach-through voltage at the internal portions less than the avalanche voltage thereof. In addition, the second collector portion at the peripheral portions also has a thickness at least 20 percent greater than of the second collector portion at said internal portions and a width at the second major surface greater than the thickness of the second collector portion at said internal portions.

Further, it is preferred that the width of the second collector portion at the second major surface is less than three times the width of the second collector portion at the internal portions. Also it is preferred that the first collector portion laterally circumscribe the emitter region by at least the thickness of the second collector portion at the internal portions and that the minority carrier diffusion length of the second collector portion is at least one order of magnitude greater than the thickness of the second collector portion at said internal portions of the body.

The transistor also includes a base region of conductivity type opposite from the emitter and collector regions. The base region adjoins the first major surface contiguously around the emitter region and adjoins the emitter region and the second collector portion interior of the semiconductor body at the internal portions to form separate PN junctions therewith. The base region has a minority carrier diffusion length less than an order of magnitude greater than the thickness of the base region at the internal portions.

In operation, the blocking voltage of the transistor is supported primarily by the second collector portion at the internal portions. Surface breakdown is avoided by having peripheral portions of the second collector portion be capable of supporting a larger space-charge region than at the internal portions. The blocking voltage is thus controlled by the bulk reach-through voltage of the second collector portion at the internal portions of the body.

The high speed capability is provided by the electric field condition of the second collector portion extending substantially uniformly at the internal portions. The charge is thus rapidly swept out of the collector and base regions at the internal portions under the influence of the bias field, rather than by carrier diffusion and recombination. Further, the bulk of the second collector portion at the peripheral portions and the injection of carriers into the second collector portion at the peripheral portions can both be minimized so that the stored charge in that portion of the second collector portion which must be removed by carrier diffusion is minimized.

Other details, objects and advantages of the invention will become apparent as the following description of the presently preferred embodiments and the presently preferred methods for making and practicing the same proceeds.

BRIEF DESCRIPTION OF THE DRAWINGS

In the accompanying drawings, the presently preferred embodiments of the invention and presently preferred methods for making and practicing the invention are illustrated, in which.

DESCRIPTION OF THE PREFERRED EMBODIMENTS

Figure 1:
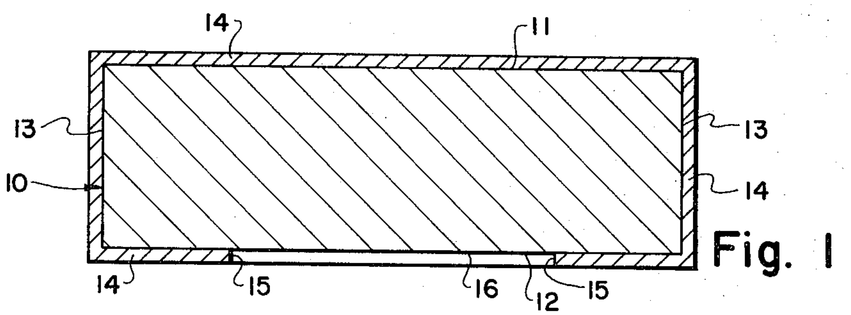
FIGS. 1 through 5 are cross-sectional views in elevation through the center of a transistor embodying the present invention at various stages in its manufacture.

Referring to FIG. 1, a transistor is provided in a semiconductor body 10 having first and second opposed major surfaces 11 and 12, and side surfaces 13. The transistor may have an NPN or PNP structure. For purposes of illustration, an NPN transistor shall be shown, with the understanding that the invention may be also embodied by a PNP transistor. The invention is contemplated to have particular utility in a PNP transistor because of the higher diffusion rates of P-type impurities (i.e. gallium and aluminum) and of the reduction in surface channeling effects by the dilute electric field which results at the edge of the device.

Accordingly, for an NPN transistor, body 10 is an N-type silicon wafer having a resistivity greater than 30 ohm-cm (i.e. an impurity concentration less than $2 \times 10^{14}$ atoms/cm$^3$) and preferably greater than 80 ohm-cm, and a thickness preferably between 100 and 500 microns, with 150 and 250 microns being most typical.

Fabrication of the transistor is then commenced by forming diffusion mask layer 14 over surfaces 11, 12 and 13 of the semiconductor body 10. Diffusion mask layer 14 may be formed by vapor or sputter deposition of a suitable material such as silicon dioxide, aluminum oxide, silicon nitride or silicon monoxide in oxygen. Typically, however, diffusion mask layer 14 is formed by heating body 10 in an oxygen-rich atmosphere such as steam to about 1200°C for 4 to 7 hours. Alternatively, silicon nitride may be similarly formed by heating the body 10 in a silane-nitrogen atmosphere at about 850°C for about 60 minutes. Mask layer 14 preferably has a thickness between 2,000 and 20,000 A, with 15,000 A being most typical for silicon dioxide.

Window pattern 15 is then opened in mask layer 14 to expose internal portions 16 of major surface 12 suitable for selective diffusion of an N-type impurity region into body 10 to form first collector portion 17. The window pattern is preferably opened by standard photolithographic and etch techniques. A suitable etchant for this purpose is buffered hydrofluoric acid.

Figure 2:
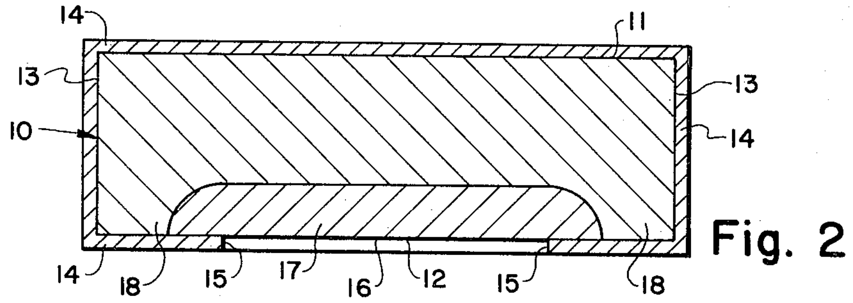
Figure 3:
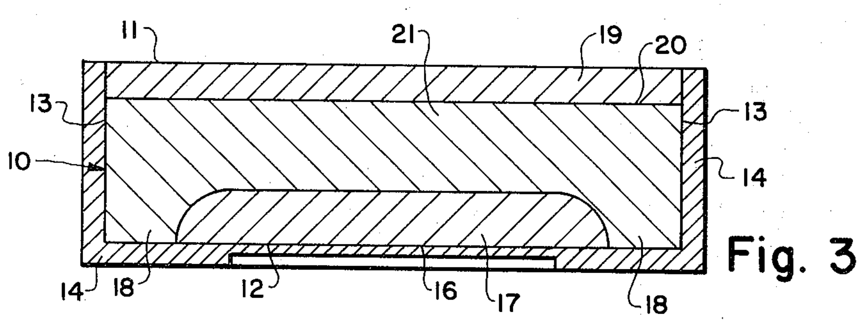

Referring to FIG. 2, semiconductor body 10 then has selectively diffused through window pattern 15 into major surface 12 an N-type impurity to form a first collector portion 17 in internal portions 16 of the body 10 adjoining major surface 12. The diffusion is performed by placing body 10 in a standard diffusion furnace and heating the body to about 1150°C for about 100 minutes in the presence of a gas or vapor of a compound containing the N-type impurity, such as phosphine ($PH_3$), phosphorus trichloride ($PCl_3$), or phosphorus oxychloride ($POCl_3$). Phosphorus is thus diffused into the exposed portions of major surface 12 at window pattern 15. Body 10 is thereafter typically heated at about 1200°C in an inert atmosphere such as argon for about 20 to 60 hours to drive the phosphorus into body 10 to provide a given substantially deep depth for first collector portion 17 for the reasons hereinafter explained. The diffusion may be similarly formed with gases or vapors, e.g. arsine ($AsH_3$), stibine ($SbH_3$) and halides and oxyhalides thereof, of other N-type impurities such as antimony or arsenic.

First collector portion 17 is thus positioned in internal portions 16 of body 10 adjoining major surface 12. The surface impurity concentration of first collector portion 17 is greater than about $8 \times 10^{18}$ atoms/cm$^3$, with about $1 \times 10^{20}$ atoms/cm$^3$ and greater being most typical, to provide good ohmic contact and low saturation voltage in the collector region of the transistor. To attain this high surface concentration with the deep diffusion, it may be necessary to perform a third, reinforcement diffusion into the semiconductor body.

The depth of first collector portion 17 will, of course, vary with the thickness of body 10 and the blocking voltage capacity desired for the transistor. Preferably, the depth of first collector portion will vary between 25 and 100 microns, with 60 microns being a typical depth.

Further, the width of first collector portion 17 is selected so that the width at major surface 12 between first collector portion 17 and side surfaces 13 of body 10 (i.e. second collector portion 21 as hereinafter described) is greater than the thickness of second collector portion 21 (hereafter described) at internal portions 16. This arrangement provides that the space-charge region does not break through to the surface 13 and cause channeling during operation.

Conversely, the width of peripheral portions 18 shall not be greater than 3 times the thickness of second collector portion 21 at internal portions 16 to avoid impairment of the switching speed and high frequency operation because of stored charge in the peripheral portions 18 of the second collector portion 21. Therefore, the width of peripheral portions 18 is preferably between one and one-half and three times the thickness of second collector portion 21, with two times the thickness of second collector portion being typical. This latter dimension is selected to provide high voltage breakdown, yet minimize stored charge in the collector region.

The fabrication is then continued by regrowing diffusion mask layer 14 to close window pattern 15. Typically the regrowth is performed by heating body 10 in an oxygen-rich atmosphere as above described. The regrowth is preferably continued until the thickness of layer 14 is increased by at least 2,000 A and typically about 5,000 A. Mask layer 14 is then removed from major surface 11 by standard photolithographic and etch techniques.

A P-type impurity is then diffused into exposed major surface 11 to form a P-type impurity region for base region 19. The diffusion is typically performed by heating body 10 at about 1,050°C for 15 minutes in the presence of a gas or vapor such as boron oxide ($B_2O_3$), boron tribromide ($BBr_3$) or diborane ($B_2H_6$). Boron is thus deposited on the exposed major surface 11. Body 10 is typically thereafter heated at about 1,200°C in an inert atmosphere such as argon for about 6½ hours to drive the boron into body 10 to a given depth. The diffusion may be similarly performed with vapors or gases of other P-type impurity such as gallium or aluminum. Alternatively, a doped oxide for a diffusion source, or an ion implantation may be used for low surface impurity concentrations for base region 19.

The diffusion depth of base region 19 determines the electrical characteristics of the transistor. The base region forms PN junction 20 with the residual impurity originally grown in body 10 as commercially obtained. The diffusion therefore forms between base region 19 and first collector portion 17, second collector portion 21 and determines the thickness of second collector portion 21 at internal portions 16.

Second collector portion 21 thus formed adjoins selected peripheral portions 18 of major surface 12 contiguously around first collector portion 17 and adjoins first collector portion 17 interior of body 10 at internal portions 16. Second collector portion 21 also has a resistivity greater than about 30 ohm-cm and preferably greater than about 80 ohm-cm, corresponding to the resistivity of body 10. Second collector portion 21 at internal portions 16 has a substantially uniform thickness of at least about 30 microns and preferably greater than 50 microns (for 400 volt capacity) and preferably greater than about 95 microns (for 1,000 volt capacity) and about 190 microns (for 3,000 volt capacity). Further, second collector portion 21 at the internal portions 16 has a reach-through voltage less than the avalanche breakdown voltage thereof, and preferably has a minority carrier diffusion length at least an order of magnitude greater than the thickness thereof. Further, the second collector portion 21 has at peripheral portions 18 a thickness at least 20 percent greater than the thickness of said second collector portion at internal portions 16.

To obtain these parameters, the thickness of semiconductor body 10 is selected with a view to the desired electrical characteristics. The regulatory diffusion is typically the selective diffusion of first collector portion 17. Although critical to determine the thickness of second collector portion 21 at internal portions 16, the subsequent base diffusion is typically less deep to better control the base thickness and minimize the diffusion depth of the emitter region as hereafter described. Preferably the base diffusion is to between 10 and 20 microns, with 15 microns being typical.

Figure 4:
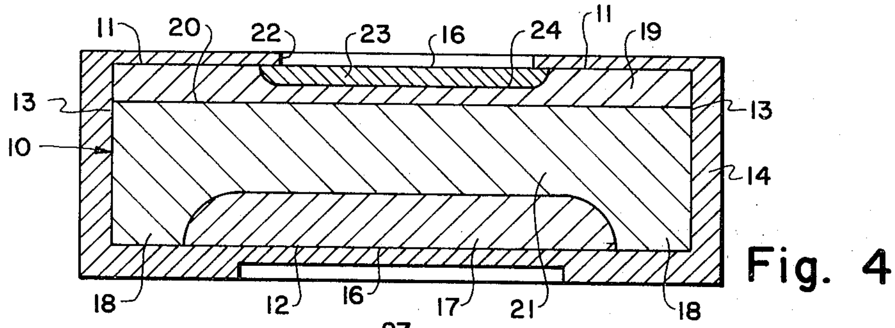

Referring to FIG. 4, a fabrication is continued by again regrowing diffusion mask layer 14. Again the regrowth is done by heating body 10 in an oxygen-rich atmosphere as above described. The regrowth is continued until mask layer 14 increases in thickness by at least 2,000 A and typically about 5,000 A.

Thereafter window pattern 22 is opened in mask layer 14 to expose selected internal portions 16 of major surface 11 suitable for selective diffusion of an N-type impurity region into body 10 to form emitter region 23. The window pattern is preferably opened by standard photolithographic and etch techniques. The area of internal portions 16 selected is preferably greater than 0.10 $cm^2$ and typically between 0.25 and 0.50 $cm^2$.

An N-type impurity is then selectively diffused into the exposed portions of major surface 11 to form emitter region 23 in internal portions 16 of body 10 adjoining major surface 11. The diffusion is preferably performed by a standard diffusion technique such as that above described.

Emitter region 23 is thus formed having a surface impurity concentration preferably between $3 \times 10^{19}$ and $7 \times 10^{19}$ atoms/$cm^3$, with $8 \times 10^{19}$ atoms/$cm^3$ being typical. The diffusion depth of emitter region 23 is preferably between 3 and 10 microns, with 5 microns being typical. The emitter region 23 thus also forms PN junction 24 with base region 19, and determines the thickness of the base region 19 at internal portions 16 of body 10.

In this connection, the thickness of the base region at the internal portions 16 is selected so that it is at least an order of magnitude less than the minority carrier diffusion length of the base region, and most typically 0.2 to 0.1 times the diffusion length in the base region, to provide a high current gain through the transistor. Preferably the base thickness at the internal portions 16 is therefore between 5 and 15 microns, with 8 microns being typical.

The impurity concentration through base region 19 at the internal portions 16 is preferably between about $8 \times 10^{15}$ atoms/$cm^3$ and $1 \times 10^{17}$ atoms/$cm^3$.

The width of emitter region 23 is also selected so that it is laterally circumscribed by first collector portion 17. Preferably, first collector portion 17 of the collector region circumscribes and is spaced around emitter region 23 by at least the thickness of second collector portion 21 at internal portions 16 as above described. By this arrangement, carrier injection from emitter region 23 through base region into peripheral portions 18 of second collector portion 21 is avoided and stored charge in the peripheral portions 18 is reduced. On the switching, speed and power losses are in turn substantially reduced and minimized.

Figure 5:
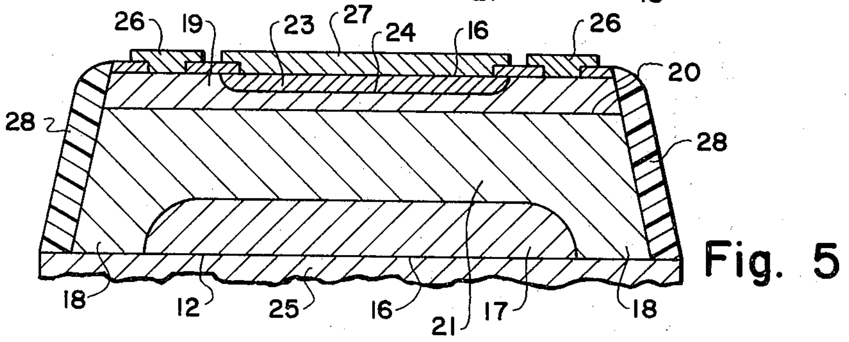

Referring to FIG. 5, the mask layer 14 is then removed from everywhere but major surface 11 typically by etching with a suitable etchant such as buffered hydrofluoric acid. Metal contact 25 is then alloyed to major surface 12 to make ohmic contact to first collector portion 17 and second collector portion 21 around first collector portion 17. Contact 25 may consist of a foil or strip of, for example, aluminum alloy affixed to major surface 12 by heating body 10, with the foil or strip in place, in an inert atmosphere at about 700°C so that the diffusion bond is formed between the body and the alloy. Alternatively, metal contact 25 may be affixed to major surface 12 by a solder layer (not shown) composed of either a hard solder (i.e. having a melting point above 375°C) such as silver, tin or gold alloy, or a soft solder (i.e. having a melting point below 375°C) such as tin.

Annular metal contact 26 and circular metal contact 27 are then positioned on major surface 11 to make ohmic contact to base region 19 and emitter region 23, respectively. The contacts are preferably formed by first opening an annular window pattern in layer 14 around emitter region 23 to expose selected portions of major surface 11. Contacts 26 and 27 can then be affixed by selectively masking and evaporation depositing aluminum onto the selected portions of major surface 11 in and adjacent the window patterns to a thickness of about 30,000 A. Alternatively, the contacts 26 and 27 may be formed by indiscriminate evaporation deposition over the structure at major surface 11 and thereafter selective removal of the metal layer with standard photolithographic and etch techniques.

The transistor is then completed by spin-etching body 10 by known procedures to champfer side surfaces 13 to reduce edge leakage and edge voltage breakdown during transistor operation. Then side surfaces 13 of semiconductor body 10 are coated with a protective coating 28 formed by incorporating for example, 1,2-dihydroxyanthraquinone (also called "alizarin" and "lizaric" acid) alone or in combination with silicone or epoxy resin to substantially reduce atmospheric effects on the transistor.

Figure 6:
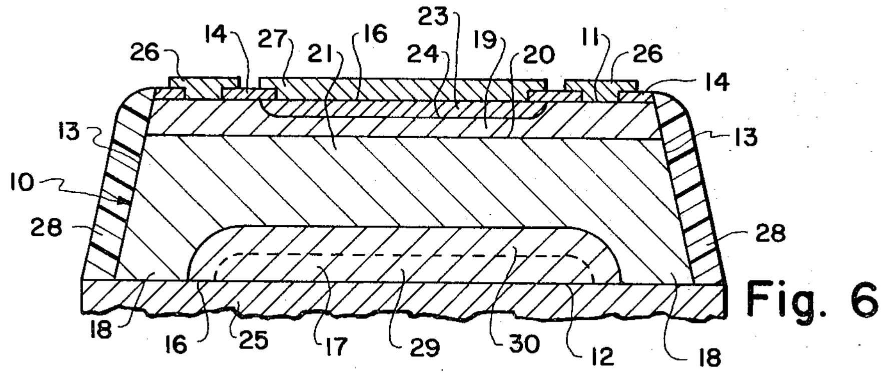
FIG. 6 is a cross-sectional view in elevation of an alternative transistor embodying the present invention.

Referring to FIG. 6, an alternative transistor embodying the present invention is shown which has improved surge voltage characteristics. The present invention, therefore, utilizes in combination the invention described in copending U.S. Pat. application Ser. No. 259,404, filed June 5, 1972 and assigned to the same assignee as the present invention.

The transistor is the same as that described in connection with FIGS. 1 through 5 except that, in addition, first and second diffusion portions are provided in first collector portion 17. In addition, it is preferred that this embodiment be provided with a PNP structure.

Specifically, first diffusion portion 29 adjoins major surface 12 and has a steep impurity concentration gradient ranging from about $2.5 \times 10^{21}$ atoms/$cm^4$ (a 40 micron depth diffusion of $1 \times 10^{19}$ atoms/$cm^3$ surface concentration) to about $1.0 \times 10^{24}$ atoms/$cm^4$ (a 10 micron depth diffusion of $1 \times 10^{21}$ atoms/$cm^3$ surface concentration), and a high dopant concentration greater than about $1 \times 10^{19}$ atoms/$cm^3$ at the surfaces. Second contiguous diffusion portion 30 adjoins the second collector portion 21 and has a shallower impurity concentration gradient than first diffusion portion 29, and a lower impurity concentration than first diffusion portion 29 but higher than second collector portion 21. Specifically, second diffusion portion 30 has an impurity concentration grading between about $1.3 \times 10^{20}$ atoms/$cm^4$ (a 75 micron depth diffusion of $1 \times 10^{18}$ atoms/$cm^3$ surface concentration) to about $5 \times 10^{21}$ atoms/$cm^4$ (a 20 micron depth diffusion of $1 \times 10^{19}$ atoms/$cm^3$ surface concentration), and an impurity concentration ranging between $1 \times 10^{14}$ and $1 \times 10^{17}$ atoms/$cm^3$.

Preferably first and second diffusion portions 29 and 30 are simultaneously performed by diffusion of a mixture of boron and gallium and/or aluminum. The first and second diffusion portions 29 and 30 are thus formed by virtue of the diverse diffusion rates between boron on the one hand and gallium and aluminum on the other hand. The procedure for this one step diffusion is described by reference to application Ser. No. 218,097, filed Jan. 17, 1972 and assigned to the same assignee as the present application.

Figure 7:
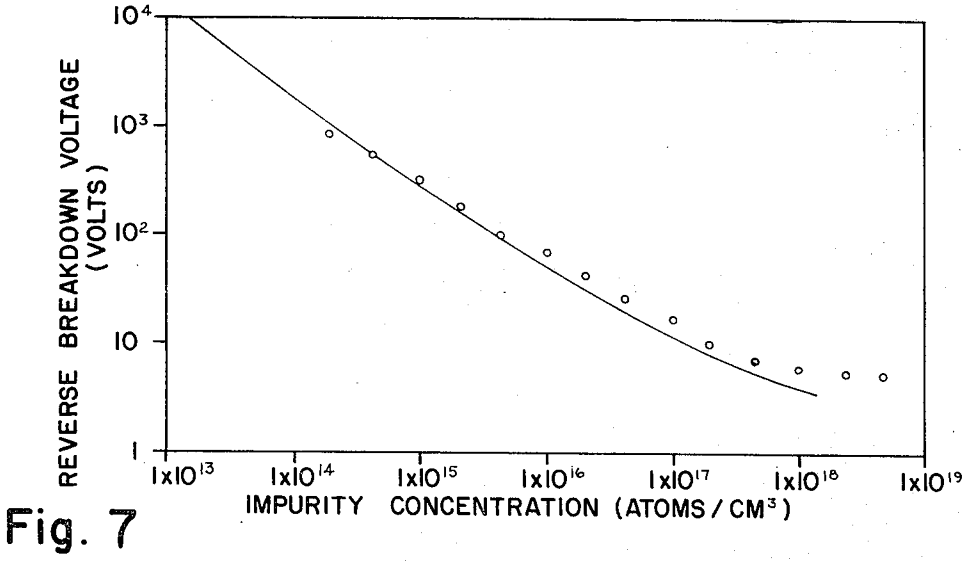
FIG. 7 is a graph showing experimental and calculated plots of collector region doping versus design voltage for silicon semiconductor material.
Figure 8:
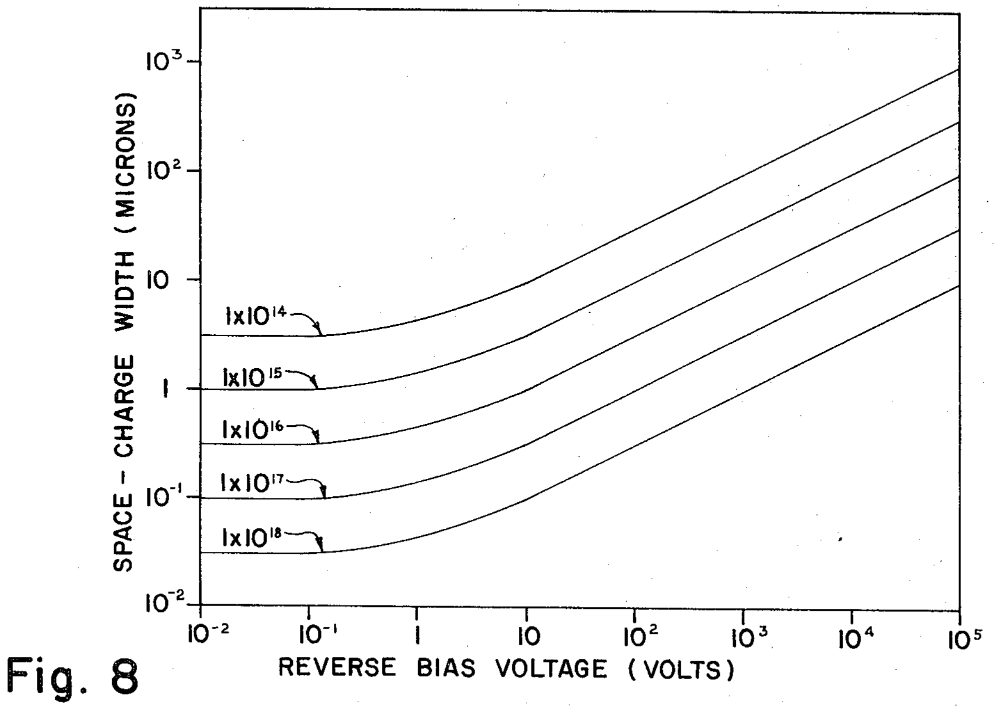
FIG. 8 is a graph showing a plot of collector region thickness versus design voltage assuming an abrupt step junction at the PN junction between the collector and base regions.
Figure 9:
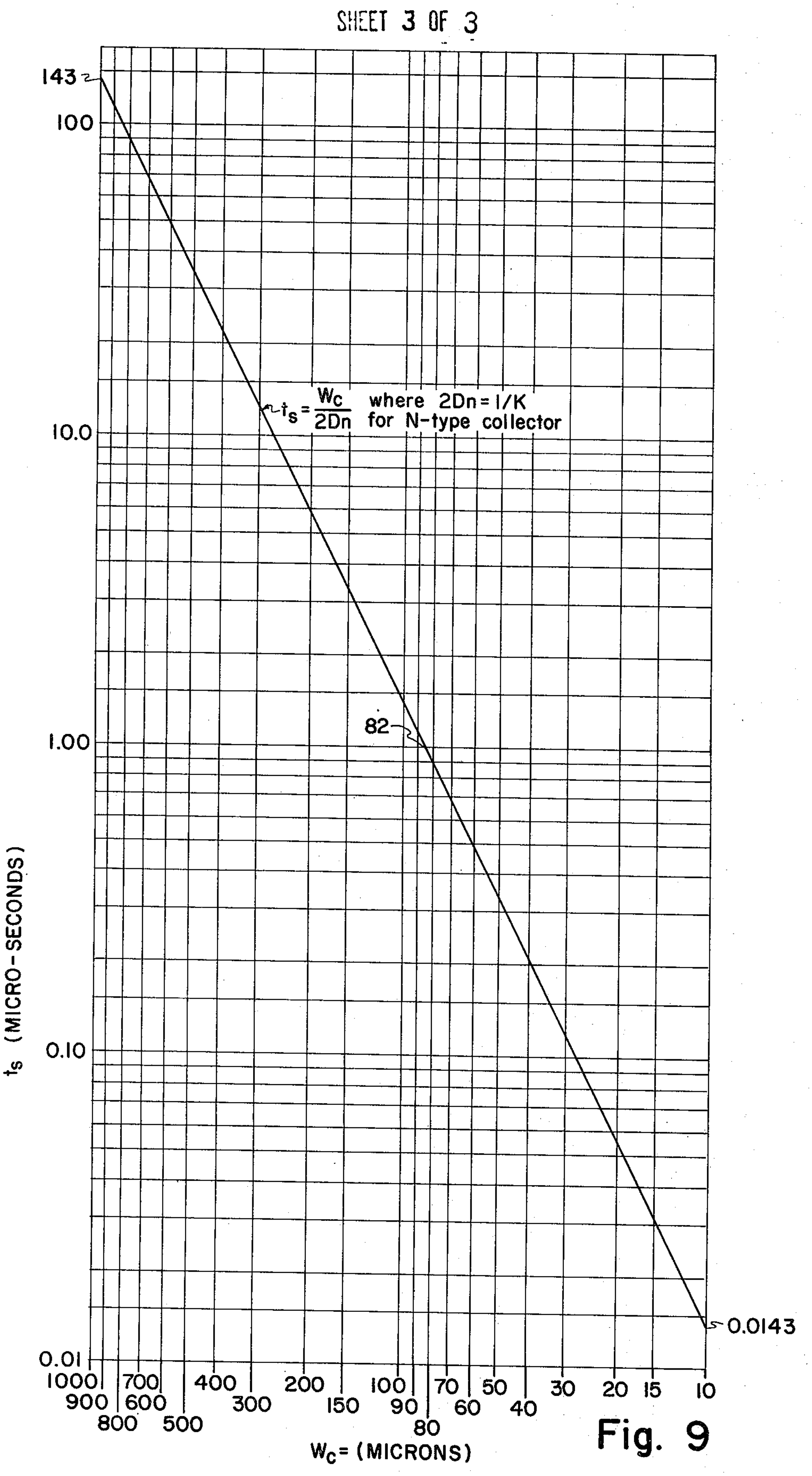
FIG. 9 is a logarithmic plot showing the change in storage time for changes in collector region thickness.

FIGS. 7, 8 and 9 provide for the design of a transistor of the desired electrical characteristics in accordance with the present invention.

FIG. 7 shows the change in reverse breakdown voltage with change in impurity concentration for a one-sided step junction for silicon semiconductor material. The solid line is calculated based on ionization rates. The dotted line is experimentally measured values for silicon. It should be noted that a one-sided step junction assumes that the reverse breakdown voltage is sustained on one side of the junction and that the impurity concentration on the other side of the junction is infinitely large. The one-sided step junction provides a good approximation for the present invention because the impurity concentration in second collector portion 21 is typically several orders of magnitude less than the impurity concentration in base region 19 at internal portions 16. As shown from FIG. 7, the reverse breakdown voltage decreases in direct proportion to the increase in impurity concentration.

FIG. 8 shows the change in width of the space-charge region with changes in the reverse bias voltage across a PN junction in silicon at room temperature (i.e. 27°C) for different impurity concentration, i.e. from $1 \times 10^{14}$ to $1 \times 10^{18}$ atoms/cm$^3$. The plots are approximations based on a one-sided step junction. As shown, the width of the space-charge region increases slowly to a bias voltage of 1 volt and thereafter increases rapidly. The curve shifts downwardly one-half order of magnitude for each increase of impurity concentration by one order of magnitude.

FIG. 9 shows the change in switching speed for changes in collector thickness, and specifically the thickness of second collector portion 21 at internal portions 16. It has been empirically found that where the space-charge region is primarily in the collector region (i.e. approximates a step-junction) the storage time ($\tau_s$) (i.e. the time to remove the stored charge on cut-off) is proportional to a square of the width of the collector region ($W_c$). Thus, $\tau_s = k\ W_c^2$. Typically $k$ ranges from 0.014 to 0.007 for an N-type collector region and from 0.035 to 0.0175 for a P-type collector region where $\tau_s$, is in seconds and $W_c$ is in centimeters. It can be seen from the relationship that storage time in the transistor of the present invention is independent of impurity concentration and dependent only on the thickness of second collector portion 21 at internal portions 16.

The resulting transistor has its operation primarily in internal portions 16. Peripheral portions 18 function only to maintain the voltage capacity of the transistor. The performance characteristics of the transistor can therefore be optimized. The impurity level in the starting semiconductor body 10 and the thicknesses of the various regions can be selected to provide a collector reach-through condition in second collector portion 21 at internal portions 16 just above the design reverse breakdown voltage. No higher voltage capacity need be provided for safe operating conditions.

The speed capacity of the resulting transistor is particularly high and substantially uniform with changes in current. The stored charge is almost instantaneously withdrawn from the collector region at internal portions 16, as well as some of the stored charge in the collector region at peripheral portions 18, particularly where the minority carrier diffusion length is at least an order of magnitude greater than the thickness of second collector portion 21. In turn, part of the remaining stored charge in the collector region at peripheral portions 18 collapses into internal portions 16 of second collector portion 21 and is readily pulled out of the transistor by the potential across internal portions 16. Only a relatively small amount of the stored charge in the collector region at peripheral portions 18 need be disposed of by diffusion and recombination and therefore fast switching and high frequency capacity are provided. Furthermore, the uniform thickness of second collector portion 21 in internal portions 16 provides uniform switching speed substantially independent of the amount of current through the transistor.

Accordingly, the NPN transistor of FIGS. 1 through 5 can be designed with the desired electrical characteristics by the selection of the desired current gain ($\beta$), current capacity (I), and breakdown voltage ($V_{CEO}$) or the switching time ($t$). For example, assume that in an NPN transistor the desired collector-emitter current gain ($\beta$) is 75 and the desired collector-emitter saturation voltage (base open) $V_{CEO}$ is 400 volts. The required collector-base avalanche voltage (emitter open) can be calculated [$V_{CEO} = (\beta)$ ⅓ $V_{CEO}$] to be about 990 volts. From FIG. 7, the required level of impurity concentration for second collector portion 21 and in turn the impurity level for semiconductor body 10 can be determined (i.e. about $1 \times 10^{14}$ atoms/cm$^3$). The impurity concentration established, the required space-charge width and in turn the thickness of second collector portion 21 at internal portions 16 for punch-through can be determined from FIG. 8 (i.e. approximately 120 microns).

Subsequently from FIG. 9, the switching speed is found to be a maximum of 2.0 microseconds where $k = 0.014$. This is for low level conditions where the charge density does not exceed the impurity concentration in the second collector portion of the collector region. However, for high power transistor, a high level condition exists where the charge density is greater than the impurity concentration in the second collector portion of the collector region. In the high level mode, k is reduced to about 0.007 and in turn causes the switching speed to be even faster.

Thus, if the starting semiconductor body 10 is 220 microns in thickness, base region 18 is 15 microns in thickness, first collector portion is 85 microns in depth.

Likewise, the transistor can be designed for a given switching speed. The thickness of second collector portion 21 at internal portions 16 can be determined from FIG. 9 and in turn the voltage capacity and impurity concentrations can be determined from FIGS. 7 and 8.

In either case, the voltage capacity and the switching speed of the transistor is still to some extent a compromise one for the other as in prior devices. Transistors as high as 10,000 volts capacity are contemplated to be made by the present invention; the thickness of the starting semiconductor body is simply correspondingly larger, e.g. about 2,500 microns for 10,000 volts. The point is, however, that transistors of the present invention are, for a given voltage capacity, more than ten times faster in switching speed and have correspondingly higher frequency responses than prior transistors of the same voltage capacity.

The area of the internal portions 16 at emitter region 23 is determined for the desired current capacity. The maximum current density is governed by the high level injection condition which gives about $1 \times 10^4$ amps/cm$^2$. However, in practice much lower densities are used. Typically, for silicon, $j$ is about 300 amps/cm$^2$ or less if lower saturation voltage is desired. Thus the area is determined by $A = I/j$. For example, for 75 amperes capacity, the needed area of the emitter surface at internal portions 16 is determined to be 0.25 cm$^2$. The operating current is, however, well below the maximum, i.e. 50 amperes in the example. Accordingly, the surface area of major surface 11 adjoining emitter region 23 at window 22 is preferably greater than 0.10 cm$^2$ and most desirably 0.25 to 0.50 cm$^2$.

While the presently preferred embodiments of the invention and methods for making them have been specifically described, it is distinctly understood that the invention may be otherwise variously embodied and used within the scope of the following claims.

What is claimed is:

1. A transistor having high voltage and high speed capability comprising:

A. a semiconductor body having first and second opposed major surfaces, a resistivity therethrough or at least about 30 ohm-cm and a thickness of at least about 100 microns;

B. an emitter region of a given conductivity type positioned in the body adjoining selected internal portions of the first major surface;

C. a collector region of conductivity type the same as the emitter region positioned in the body adjoining the second major surface and comprising a first collector portion and a second collector portion;

D. said first collector portion adjoining selected internal portions of the second major surface and having a surface impurity concentration at the second major surface greater than about $8 \times 10^{18}$ atoms/cm$^3$.

E. said second collector portion adjoining selected peripheral portions of the second major surface contiguously around the first collector portion and adjoining the first collector portion interior of the body at said internal portions, and having a resistivity therethrough of greater than 30 ohm-cm;

F. said second collector portion at said internal portions having a substantially uniform thickness of at least about 30 microns and a reach-through voltage less than the avalanche breakdown voltage thereof, and said second collector portion at said peripheral portions having a thickness at least 20 percent greater than the thickness of second collector portion at said internal portions and having a width at the second major surface greater than the width of the second collector portion at said internal portions;

G. a base region of conductivity type opposite from the emitter and collector regions positioned at least partially interior of the body between the emitter region and the second collector portion of collector region and forming separate PN junctions therewith, and having a minority carrier diffusion length at least on the order of magnitude greater than the thickness of the base region at the internal portions of the body; and H. metal contacts affixed to the major surfaces of the body to make separate ohmic contact with emitter, collector and base regions.

2. A transistor having high voltage and high speed capability as set forth in claim 1 wherein:

the second collector portion of the collector region has a width adjoining the second major surface at said peripheral portions between one and one-half and three times the thickness of the second collector portion at said internal portions of the body.

3. A transistor having high voltage and high speed capability as set forth in claim 1 wherein:

the first collector portion of the collector region laterally circumscribes the emitter region by at least the thickness of the second collector portion at the internal portions of the body.

4. A transistor having high voltage and high speed capability as set forth in claim 1 wherein:

the first collector portion is comprised of first and second diffusion portions, said first diffusion portion adjoining said second major surface and having a dopant concentration of at least $1 \times 10^{19}$ atoms per cm$^3$ at said second major surface and a steep dopant concentration gradient to provide for good ohmic and thermal contact properties, and said second diffusion portion adjoining the second collector portion and having lower impurity concentrations than said first diffusion portions and having a shallower dopant concentration gradient than said first diffusion portion to provide surge voltage capacity in the transistor without reverse voltage breakdown.

5. A transistor having high voltage and high speed capability as set forth in claim 4 wherein:

said first collector portion is comprised of P-type impurity, the first diffusion portion of said first collector portion being doped primarily with boron, and the second diffusion portion of said first collector portion being doped with at least one dopant selected from the group consisting of gallium and aluminum.

* * * * *